US006774663B2

(12) United States Patent
Moreaux et al.

(10) Patent No.: US 6,774,663 B2
(45) Date of Patent: Aug. 10, 2004

(54) CIRCUIT FOR THE DETECTION OF A DEFECTIVE POWER SUPPLY CONNECTION

(75) Inventors: Christophe Moreaux, Eguilles (FR); Ahmed Kari, Aix en Provence (FR)

(73) Assignee: STMicroelectronics SA, Montrouge (FR)

( * ) Notice: Subject to any disclaimer, the term of this patent is extended or adjusted under 35 U.S.C. 154(b) by 48 days.

(21) Appl. No.: 10/060,105

(22) Filed: Jan. 29, 2002

(65) Prior Publication Data

US 2002/0135379 A1 Sep. 26, 2002

(30) Foreign Application Priority Data

Jan. 30, 2001 (FR) .............................................. 01 01253

(51) Int. Cl.[7] .......................... G01R 31/36; G06K 19/06
(52) U.S. Cl. ...................................... 324/771; 235/492
(58) Field of Search ................................ 324/500, 537, 324/771; 235/492

(56) References Cited

U.S. PATENT DOCUMENTS 6,027,029 A * 2/2000 Kim ........................... 235/492

OTHER PUBLICATIONS

Patent Abstracts of Japan, vol. 013, No. 570, (P–977), Dec. 18, 1989 & JP 01237894 A (Hitachi Maxell Ltd.), Sep. 22, 1989.

Patent Abstracts of Japan, vol. 1995, No. 02, Mar. 31, 1995 & JP 06325222 A (Fuji Electric Co. Ltd.) Nov. 25, 1994.

Patent Abstracts of Japan, vol. 2000, No. 16, May 8, 2001 & JP 2001 005916 A (Matsushita Electric Ind. Co. Ltd.) Jan. 12, 2001.

\* cited by examiner

*Primary Examiner*—Anjan Deb
*Assistant Examiner*—Donald M Lair
(74) *Attorney, Agent, or Firm*—Lisa K. Jorgenson; Allen, Dyer, Doppelt, Milbrath & Gilchrist, P.A.

(57) ABSTRACT

A device for detecting a defective power supply connection in an integrated circuit includes a comparison circuit for comparing voltage levels of an input/output pad of the integrated circuit and an internal power supply line connected to a power supply pad of the integrated circuit. A pull-down or pull-up device is connected between the input/output pad and the internal power supply line.

12 Claims, 2 Drawing Sheets

CIRCUIT FOR THE DETECTION OF A DEFECTIVE POWER SUPPLY CONNECTION

FIELD OF THE INVENTION

The present invention relates to detection circuits, and more particularly, to a detection circuit for detecting a defective power supply connection.

BACKGROUND OF THE INVENTION

Using a smart card as an example, the integrated circuit within such a card receives its power from a coupler or card reader, which typically includes Vdd and Gnd. The quality of this card/coupler link may be defective, wherein the serial contact resistance values are very high. The quality may be affected by wear and tear or corrosion of the pads of the integrated circuit. Another cause of deterioration in the quality of the card/coupler link is fraud. That is, an ill-intentioned third party may deliberately damage this link, for example, by putting adhesive on one or more pads of the card to cause it to operate abnormally.

When the card/coupler connection is defective with respect to the power supply pads, the internal power supply of the integrated circuit can be obtained indirectly by the input/output pads of the integrated circuit. This is done through the pull-down or pull-up elements (e.g., resistors and diodes) connected between these pads and an internal supply voltage. However, this may lead to a significant malfunctioning in the integrated circuit.

Taking as an example an integrated circuit with two power supply pads for receiving a ground voltage Gnd and a logic supply voltage Vdd through the coupler, at least one input/output pad with a ground (GND) pull-down element using a resistor will be referenced Rpd. This pad receives a default level from the coupler, which corresponds to ground. This level may change during very short periods of time corresponding to clock pulses of the circuit/coupler link.

By default, the integrated circuit is in a first mode of operation in which it consumes current I1 (for example, in a memory read mode). Upon a command from the coupler, it may pass into a second mode of operation in which it consumes higher current I2 (for example, in a memory write mode).

An integrated circuit of this type usually comprises a power-on reset device depending on the potential difference between the internal levels of the logic supply voltage and ground in the integrated circuit. This device is active when the circuit is powered on and off. In particular, this device is activated whenever the potential difference between the internal levels of the logic supply voltage and ground falls below a specified threshold. This threshold shall be referenced Vpor. It is assumed in the example that the threshold Vpor is set at 4 volts for a five-volt logic power supply voltage Vdd.

Assuming that the power supply pad associated with ground GND shows a very high series contact resistance, ground Gnd is not properly transmitted within the integrated circuit by the pad. The input/output pad which is grounded brings the internal ground line to a voltage level VA by the associated pull-down device.

If the integrated circuit is in the first mode of operation, this internal ground level VA obtained by the pull-down resistor Rpd is equal to Rpd*I1. This means that the integrated circuit could operate properly in this first mode of operation provided that the internal ground level V1 is such that the ground potential difference between the internal level Vddint of the logic supply voltage Vdd and this internal level of ground remains higher than the reset threshold Vpor. This is written as follows:

Vddint−Va>Vpor; that is

Vddint−Rpd*I1>Vpor.

If the integrated circuit goes into the second mode of operation, the internal level Va of ground goes to a higher level (I2>I1) equal to Rpd*I2. It is then possible to have a situation where the potential difference between the internal levels of the logic supply voltage Vdd and ground Gnd fall below the reset threshold Vpor of the integrated circuit. This will deactivate the integrated circuit. Since this change in situation is not immediate, it may happen that a portion of the command related to the second mode of operation (writing in memory) is executed. This is even more disadvantageous.

SUMMARY OF THE INVENTION

In view of the foregoing invention, an object of the invention to detect a defective connection of an integrated circuit with a power supply.

Another object of the invention is to detect high values of series contact resistances at the power supply pads of an integrated circuit.

Yet another object of the invention is to detect when the power supply for an integrated circuit is not obtained by the input/output pad pull-down or pull-up devices of the integrated circuit.

These and other objects, advantages and features of the invention are provided by at least one voltage level comparison device that compares voltage levels between an internal power supply line of the integrated circuit and an input/output pad of the integrated circuit. The integrated circuit comprises a pull-down or pull-up device connected between the input/output pad and the internal power supply line.

If the voltage level at the internal supply line is dictated by the pull-down or pull-up device, this level may be greater than or lower than the voltage level of the pad. Depending on whether this difference is above or below a predetermined detection threshold, the supply is determined to be a good connection or a bad connection. Should the supply be detected as being a bad connection, the integrated circuit will inhibit its own operation. The detection device according to the invention then acts as a safety device, preventing any malfunctioning in the integrated circuit that might be caused by a defective power supply connection.

The detection device according to the invention preferably comprises a comparison circuit associated with each internal supply level. If, for a given supply voltage level, there are several input/output pads, with a pull-down or pull-up device at this voltage level, then a comparison device is preferably provided for each of these pads. A detection device according to the invention is especially recommended for actively combating attempts at fraud designed to give rise to the abnormal operation of the integrated circuit.

The device can also be applied in cases of normal use of the integrated circuit to detect wear and tear or corrosion of the supply pads. In this type of application, the detection device will preferably be used in combination with protection circuits that may exist at the input/output pads themselves. These input/output pads may themselves be worn out or corroded due to the normal use of the integrated circuit. Hence, the power level transmitted by these pads may be degraded and the output results of the detection device according to the invention must then be considered in combination with other safety information.

As claimed, the invention therefore relates to a device for the detection of a defective power supply connection in an integrated circuit. According to the invention, in an integrated circuit comprising at least one power supply pad for applying an external power supply to an internal power supply line of the integrated circuit and at least one input/output pad with which there is associated a pull-down or pull-up device connected between the pad and the internal supply line, the detection device comprises a circuit for the comparison of the voltage levels between the pad and the internal supply line. The signal delivered by the detection device may be used to inhibit the internal operation of the integrated circuit.

BRIEF DESCRIPTION OF THE DRAWINGS

Other features and advantages of the invention are given in the following description, by way of a non-restrictive indication, with reference to the appended drawings of which.

DETAILED DESCRIPTION OF THE PREFERRED EMBODIMENTS

Figure 1:
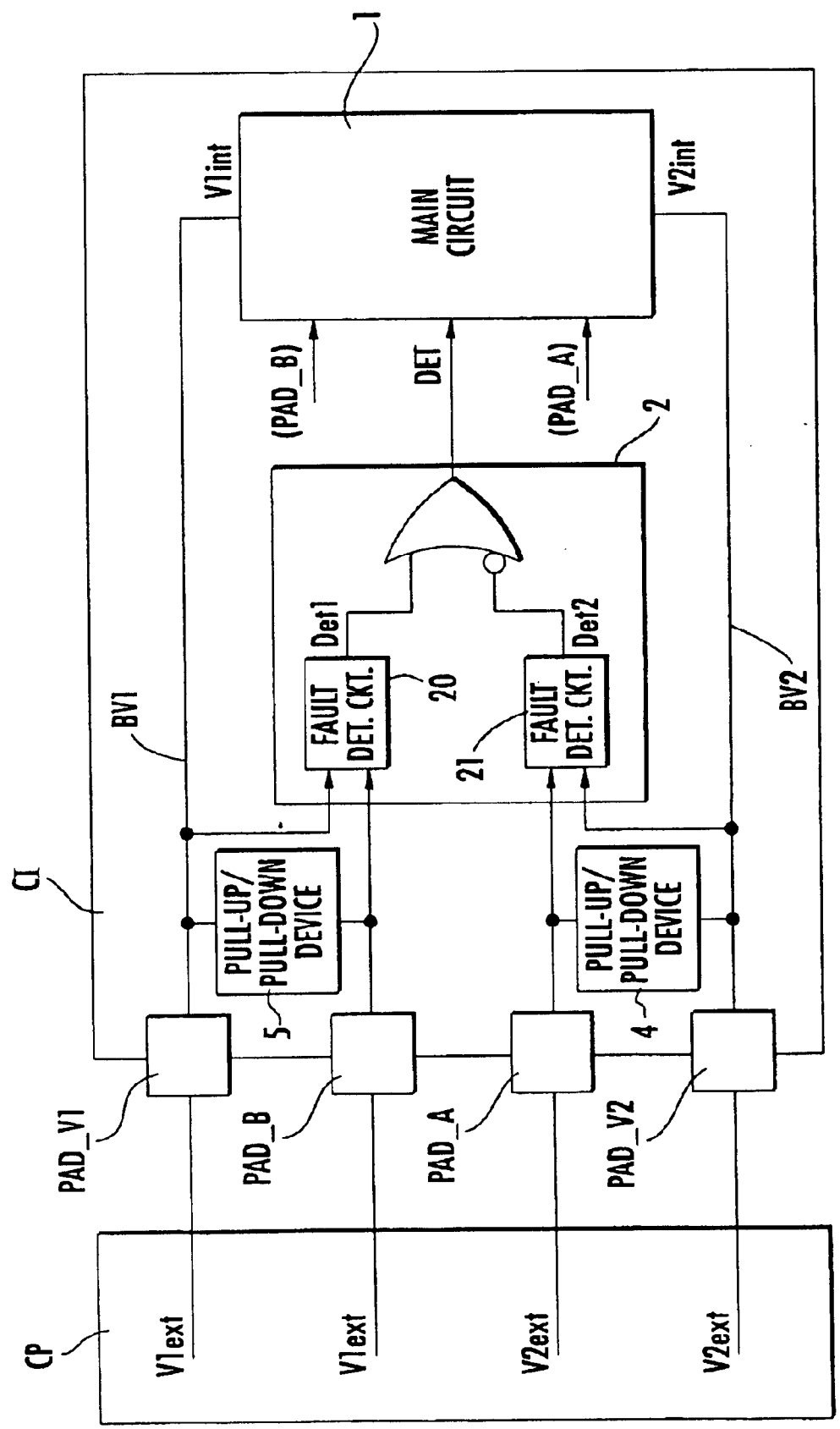
FIG. 1 is a general block diagram of the detection device in an integrated circuit according to the invention.

FIG. 1 is a block diagram of an integrated circuit CI having connection pads for receiving signals from a coupler CP. The integrated circuit comprises a detection device 2 according to the invention.

The integrated circuit CI has a main circuit 1, and the detection circuit 2 for detecting defective power supply connections and defective connection pads. A first supply connection pad PAD-V1 is connected to a first internal logic supply line BV1 and receives an external supply voltage V1ext from the coupler CP. A second connection pad PAD-V2 is connected to a second internal logic supply line BV2 and receives an external supply voltage V2ext from the coupler CP.

The values are chosen such that V1ext>V2ext. These logic supply voltages may, for example, correspond respectively to a positive logic supply voltage Vdd, for example, of about 3.3 volts, and to ground Gnd. However, the invention is not limited to any particular logic supply voltage levels. When the connections are high-quality connections, an internal supply level is received on the internal power supply lines, with V1int and V2int respectively corresponding to the levels of the external supply voltages applied to the power supply pads, namely V1ext and V2ext.

The integrated circuit CI also comprises input/output pads with a pull-down or pull-up device at one of the internal supply voltage levels. In the example, a first input/output pad PAD-A is associated with a pull-down or pull-up device 4 connected between this pad and the second internal supply line BV2. The coupler CP sets this first pad PAD-A by default at the level of the second external supply voltage V2ext. A second input/output pad PAD-B is associated with a pull-down or pull-up device 5 connected between this pad and the first internal supply line BV1. The coupler CP sets this second pad by default at the level of the first external supply voltage V1ext.

In the example shown, the detection device 2 has a detection circuit associated with each internal supply line. A detection circuit 20 has inputs connected to the first internal supply line BV1 and the second input/output pad PAD-B. The detection circuit 20 provides a detection signal Det1 at its output as a function of the internal supply voltage level V1int on the internal supply line BV1 and of the voltage level on the input/output pad PAD-B. If the connection to the supply pad PAD-V1 is defective, the voltage level on the internal supply line BV1 is dictated by the pull-down or pull-up device 5 associated with the input/output pad PAD-B.

In this case, the voltage level V1int on the internal power supply line BV1 is lower than the real level of the external supply voltage V1ext, which is the voltage obtained on the pad PAD-B. If, on the contrary, the connection is good, then the level is substantially the same on the internal power supply line BV1 and on the input/output pad PAD-B.

Similarly, inputs of a detection circuit 21 are connected to the second supply line and to the input/output pad PAD-A. At its output, this detection circuit 21 provides a detection signal Det2, as a function of the levels at the two inputs. If the connection to the supply pad PAD-V2 is defective, the voltage level V2int on the internal power supply line BV2 is imposed by the pull-down or pull-up device 4 associated with the input/output pad PAD-A.

In this case, the voltage level V2int on the internal power supply line BV2 is higher than the real level of the external supply voltage V2ext, which is the voltage level obtained on the pad PAD-A. If, on the contrary, the connection is good, then the level is substantially the same on the internal supply line and on the input/output pad.

In the example, an output signal DET of the detection device 2 is activated when at least one of the detection signals Det1 or Det2 is activated. This indicates a defective connection on at least one of the logic supply pads. The signal DET is sent to the main circuit 1 of the integrated circuit CI, which operates as an alarm signal. In particular, the main circuit 1 can activate safety devices (not shown) that will block its operation.

An integrated circuit may comprise several input/output pads with a pull-down or pull-up device at one of the internal supply voltage levels. In this case, it is possible to provide for one detection circuit per existing input/output pad to provide similar protection of the integrated circuit CI.

Figure 2:
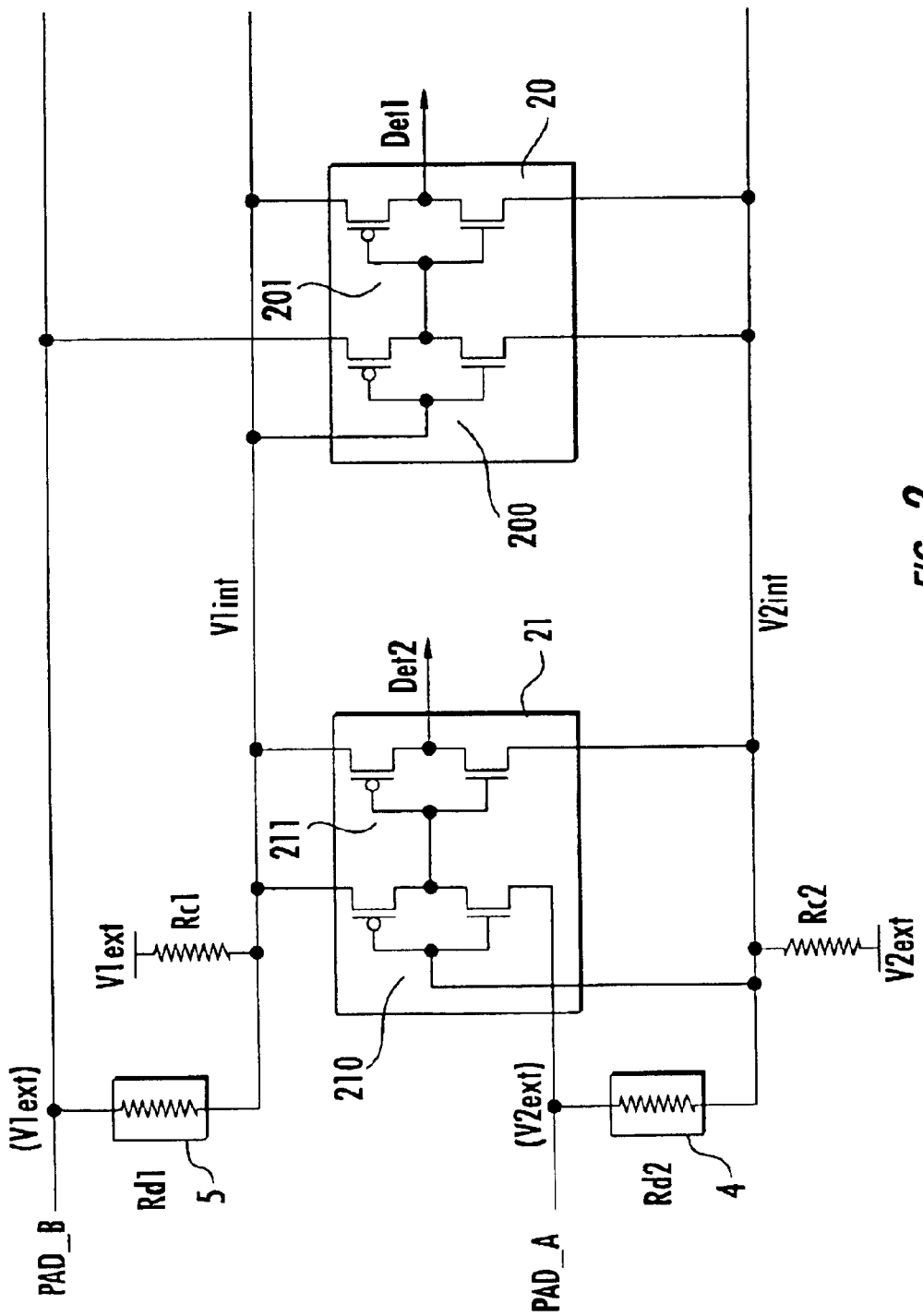
FIG. 2 is a detailed schematic diagram of an exemplary embodiment of the detection device according to the invention.

FIG. 2 shows an exemplary embodiment of comparison circuits used in a protection device according to the invention. In this example, each circuit comprises at least two inverters. A first inverter compares the voltage levels of the internal power supply line and of the input/output pad, and a second inverter reshapes the signal obtained and provides the detection signal at its output.

FIG. 2 shows the comparison circuits 20 and 21 for the two internal power supply lines BV1 and BV2. In the case of the internal power supply line BV1, the associated comparison circuit 20 is used to detect the fact that the voltage level V1int of this line is lower than the voltage level of the input/output pad PAD-B by about one transistor threshold level. In the case of the internal supply line BV2, the associated comparison circuit 21 is used to detect the fact that the voltage level V2int of this line is lower than the voltage level of the input/output pad PAD-A by about one transistor threshold level.

The comparison circuit 20 associated with the internal supply line BV1 thus comprises a first inverter 200 and a second inverter 201. The first inverter 200 is supplied between the input/output pad PAD-B and the internal power supply line BV2. The input of this inverter is connected to the internal power supply line BV1.

As long as the level of the input voltage, namely the internal supply level V1int, remains higher than or equal to the voltage level of the pad PAD-B applied as a positive supply voltage of the inverter, the output of the inverter remains at the low level. If the level V1int of the input voltage becomes lower than the voltage level of the pad PAD-B, the output of the inverter switches over to the high level. This provides for the detection according to the invention.

In practice, it is sufficient that the level V1int should become smaller than the level of the pad PAD-B by one transistor threshold. Preferably, the transistors of the inverter 200 of the comparison circuit are chosen so that they have a threshold voltage that is as low as possible. The second inverter 201 is supplied normally by the two internal supply lines BV1 and BV2, and enables the reshaping of the output signal of the first inverter.

Similarly, the comparison circuit 21 associated with the internal supply line BV2 has a first inverter 210 and a second inverter 211. The first inverter 210 is powered between the internal supply line BV1 and the input/output pad PAD-A. The input of this inverter is connected to the internal supply line BV2.

As long as the level of the input voltage, namely the internal supply level V2int remains lower than or equal to the level of the voltage of the pad PAD-A, applied as a negative supply voltage of the inverter, the output of the inverter remains at the high level. If the level V2int of the input voltage becomes higher than the level of the voltage of the pad PAD-A, the output of the inverter switches over to the low level, thus providing for the detection according to the invention.

In practice, it is sufficient that the level V2int should become higher than the voltage level of the pad PAD-A by one transistor threshold. Preferably, the transistor of the inverter 210 of the comparison circuit is chosen so that it has a threshold voltage that is as low as possible. The second inverter 211 for its part is supplied normally by the two internal supply lines BV1 and BV2 and is used to reshape the output signal of the first inverter. It will be noted that the output logic of the two comparison circuits 20 and 21 is inverted.

Other embodiments are possible, for example, using differential amplifiers. The embodiment using simple inverters has the advantage of being a low-cost embodiment in terms of space requirements on the integrated circuit and in terms of cost. In a practical example, the input/output pads PAD-A and PAD-B used for internal power supply in the event of a defective connection at the power supply pads may be pads to receive control signals by which the integrated circuit is placed in a particular mode of operation. These pads are then, by default, at voltage levels corresponding to a default mode of operation.

The change in the mode of operation of the integrated circuit is controlled by imposing a different logic voltage level on either of the pads for the duration of an edge or a clock pulse. In such a case, the detection according to the invention is permanent or semi-permanent. Such an operation corresponds especially to the mode of operation of integrated circuits designed for smart card type applications.

However, the invention cannot be applied exclusively to this type of integrated circuit. It can be applied to any integrated circuit comprising at least one input/output pad connected to an internal power supply line by a pull-down or pull-up device, corresponding to the default voltage level on this pad.

In particular, there are other input/output pads associated with pull-down or pull-up devices at one of the internal voltage supply levels, for example, the clock signal transmission pad which is commonly associated with a ground pull-down device or data input/output pads which are commonly associated with a pull-up device for pulling up to the positive logic supply voltage Vdd. In these examples, the comparison circuit associated with such a pad is active only when the level of the pad is equal to the pull-up or pull-down level.

That which is claimed is:

1. An integrated circuit comprising:
   at least one internal power supply line;
   at least one power supply pad connected to said at least one internal power supply line, and to be connected to an external device for receiving an external voltage;
   at least one input/output pad to be connected to the external device for receiving the external voltage;
   at least one of a pull-up and pull-down device connected between said at least one input/output pad and said at least one internal power supply line; and
   a detection circuit for comparing voltage levels between said at least one input/output pad and said at least one internal power supply line for determining if a power supply connection with the external device is defective.

2. An integrated circuit according to claim 1, wherein said detection circuit comprises a comparison circuit connected between each respective power supply pad and a corresponding input/output pad.

3. An integrated circuit according to claim 2, wherein each comparison circuit comprises a first inverter having an input connected to said at least one internal power supply line, and another input connected to said at least one input/output pad for receiving power therefrom.

4. An integrated circuit according to claim 3, wherein said first inverter comprises at least one transistor having a low threshold; and wherein an output of said first inverter changes when a difference in voltage levels on said at least one internal power supply line and said at least one input/output pad is at least equal to the low threshold of said at least one transistor.

5. An integrated circuit according to claim 3, wherein each comparison circuit comprises a second inverter series connected with said first inverter, said second inverter having an output for providing a defective connection signal based upon a difference in the compared voltage levels.

6. An integrated circuit according to claim 1, wherein said detection circuit generates a defective connection signal for turning off at least a portion of the integrated circuit when a difference in the compared voltage levels exceeds a threshold.

7. A smart card comprising:
   at least one internal power supply line;
   at least one power supply pad connected to said at least one internal power supply line, and to be connected to a card reader for receiving an external voltage;
   at least one input/output pad to be connected to the card reader for receiving the external voltage;
   at least one of a pull-up and pull-down device connected between said at least one input/output pad and said at least one internal power supply line; and a detection circuit for comparing voltage levels between said at least one input/output pad and said at least one internal power supply line for determining if a power supply connection with the card reader is defective.

8. A smart card according to claim 7, wherein said detection circuit comprises a comparison circuit connected between each respective power supply pad and a corresponding input/output pad.

9. A smart card according to claim 8, wherein each comparison circuit comprises a first inverter having an input connected to said at least one internal power supply line, and another input connected to said at least one input/output pad for receiving power therefrom.

10. A smart card according to claim 9, wherein said first inverter comprises at least one transistor having a low threshold; and wherein an output of said first inverter changes when a difference in voltage levels on said at least one internal power supply line and said at least one input/output pad is at least equal to the low threshold of said at least one transistor.

11. A smart card according to claim 9, wherein each comparison circuit comprises a second inverter series connected with said first inverter, said second inverter having an output for providing a defective connection based upon the difference in voltage levels.

12. A smart card according to claim 7, wherein said detection circuit generates a defective connection signal for turning off at least a portion of the smart card when a difference in the compared voltage levels exceeds a threshold.

* * * * *